United States Patent [19]

Einarsson

[11] Patent Number: 4,910,751
[45] Date of Patent: Mar. 20, 1990

[54] METHOD AND APPARATUS FOR REVERSIBLE COMPRESSION OF INFORMATION-CARRYING SYMBOLS

[75] Inventor: Göran H. Einarsson, Lund, Sweden

[73] Assignee: Telefonaktiebolaget L M Ericsson, Stockholm, Sweden

[21] Appl. No.: 207,277

[22] PCT Filed: Nov. 11, 1987

[86] PCT No.: PCT/SE87/00529

§ 371 Date: Jun. 13, 1988

§ 102(e) Date: Jun. 13, 1988

[87] PCT Pub. No.: WO88/03729

PCT Pub. Date: May 19, 1988

[30] Foreign Application Priority Data

Nov. 13, 1986 [SE] Sweden ................................. 8604863

[51] Int. Cl.$^4$ .............................................. H03M 7/40
[52] U.S. Cl. ......................................... 375/27; 375/122; 341/67
[58] Field of Search .................... 375/17, 27, 31, 122; 341/51, 59, 67; 358/261.3

[56] References Cited

U.S. PATENT DOCUMENTS 3,569,955  3/1971  Maniere ................................ 375/17
4,532,638  7/1985  Lagger et al. ......................... 375/17

FOREIGN PATENT DOCUMENTS 162714  11/1985  European Pat. Off. .
1850953  6/1986  European Pat. Off. .
417139  11/1985  Fed. Rep. of Germany .

OTHER PUBLICATIONS

P. Elias, "Predictive Coding", Parts I and II, IRE Trans. Info. Theory, vol. IT-1, Mar. 1955, pp. 16–33.
Patent Abstract of Japan, vol. 8, No. 66, (E-234), abstract of JP 58-215822, published Dec. 15, 1983.

*Primary Examiner*—Robert L. Griffin
*Assistant Examiner*—Marianne Huseman
*Attorney, Agent, or Firm*—Burns, Doane, Swecker & Mathis

[57] ABSTRACT

A method of reversibly compressing a sequence x(k) of information-carrying symbols, preferably digital signals which can assume Q discrete values, K being an index assuming integral number values, and consists in that the sequence x(k) is processed in means (1) to form a residue w(k), whereafter a modulo Q operation is carried out on the residue w(k). The modulo Q reducing sequence w(k) is finally encoded to form a compressed sequence n(k), which contains the same information as the original sequence x(k). In reconstructing the sequence x(k), the compressed sequence n(k) is decoded and subsequently processed in inversion means (5) to form a sequence y(k), on which a modulo Q operation is carried out, whereby the original sequence n(k) is obtained. An apparatus for carrying out the method includes means (1), means (2) for carrying out the modulo Q operations and an encoder (3). For carrying out the reconstruction it further includes a decoder (4), means (5) and means (6) for carrying out the modulo Q operation.

13 Claims, 3 Drawing Sheets

METHOD AND APPARATUS FOR REVERSIBLE COMPRESSION OF INFORMATION-CARRYING SYMBOLS

TECHNICAL FIELD

The present invention relates to a method of reversibly compressing a sequence x(k) of information-carrying symbols which can assume Q discrete values, k being an index which assumes integral number values, the method being that the sequence x(k) of information-carrying symbols is processed in means such as to form a residue w(k), and that the residue w(k) is encoded to form a compressed sequence n(k) of information-carrying symbols which contain the same information as the original sequence x(k).

The invention also relates to an apparatus for carrying out the method.

In practically all connections where digital information is handled, there is the interest of representing the information with as few characters as possible, in most cases with binary digits. This is the case, for example, in storing information in different memories, when it is desired to store as much information as possible in a given memory space. Another case is in the transmission of such as digitally coded speech and image information, when it is desired to transmit as much information as possible with as few bits as possible in order to decrease the transmission rate requirements.

BACKGROUND ART

A known method of compressing digital information is to use a compression technique which is called "predictive coding", and has been described, e.g. in P. Elias: Predictive Coding, Part I and II, IRE Trans. Info. Theory, Vol IT-1, March 1955, pages 16–33, and US-Pat. No. 2,605,361, C. C. Cutler, 1952. This technique includes two operations comprising:

(1) creating a sequence of residues containing the same or nearly the same information as the original sequence of digital signals,
(2) encoding the sequence of residues, e.g. with the aid of binary symbols.

DISCLOSURE OF THE INVENTION

The sequence of residues in operation 1 is formed by predicting the value of following digital signals in the sequence with the aid of the previous digital signals in the sequence. The difference between the actual digital signal and the predicted signal constitutes the residue. The object of achieving the sequence of residues is to reduce the redundancy in the original sequence of digital signals. In the second operation the residues are encoded, the encoding suitably taking place with code words of varying length, so that residues which occur often are encoded with shorter code words than the residues occuring more seldom.

The object of the present invention is to provide a method and apparatus, with which improved reversible data compression can be achieved.

The object is achieved by a method described in the introduction, characterized by a module Q being carried out on the residues before encoding.

The object is also achieved by an apparatus for carrying out the method, and is characterized by means arranged before the encoder for carrying out a module Q operation.

A higher compression degree can be achieved with this method and apparatus than what is possible with merely reversible predictive coding. The compression degree which can be achieved is determined by the entropy of the sequence w(k) of digital signals after the module Q operation has been executed. The first order entropy, which corresponds to an encoder which encodes w(k) separately for successive values of k is equal to:

$$H_{\hat{w}} = -\sum_{j=0}^{Q-1} P_{\hat{w}}(j) \log P_{\hat{w}}(j),$$

where $P_{\hat{w}}(j)$ is the relative frequency of $\hat{w}(k)=j$, where $j=0, 1, \ldots, Q-1$. The entropy will be lower, and thus the compression degree higher for $\hat{w}(k)$ that for w(k). This is a consequence of several values of w(k) resulting in the same value of $\hat{w}(k)$.

For example, if the case is assumed where the next digital signal, i.e. x(k), is predicted to have the same value as the previous digital signal, i.e. x(k−1), the residue thus being w(k)=x(k)−x(k−1), and that Q=256, the residue w(k) will assume the integral number values in the interval (−255, 255). The reduction modulo 256 signifies that $\hat{w}(k)$ is limited to the interval (0, 255), e.g. by w(k)=−17 and w(k)=239, both giving w(k)=239.

If $w_1(k)=j_1$ and $w_2(k)=j_2$ both are allowed to result in $\hat{w}(k)=j$, the entropy for w(k) will include two terms:

$$-[P_w(j_1) \log P_w(j_1) + P_w(j_2) \log P_w(j_2)],$$

which in the entropy $H_{\hat{w}}(k)$ for $\hat{w}$ are corresponded to by a term $$-P_{\hat{w}}(j) \log P_{\hat{w}}(j)$$

whereby $P_{\hat{w}}(j) = P_w(j_1) + P_w(j_2)$.

Since $$(a+b) \log (a+b) > a \log (a) + b \log (b)$$

for a, b > 0 it follows that $H_{\hat{w}} \leq H_w$, i.e. that the compression degree for the sequence of digital signals which has been subjected to a modulo Q operation is greater than for the one that has not been subjected to such an operation.

Apart from the advantage of the higher compression degree, the method and apparatus in accordance with the invention has the advantage that the encoder will be more simple by that the number of code words will be smaller, since $\hat{w}(k)$ has a smaller symbol alphabet than w(k). In addition, the invention allows simplified realization of the predictor means.

BRIEF DESCRIPTION OF DRAWINGS

The present invention will now be described by means of the various embodiments and with reference to the accompanying drawings, in which.

BEST MODES FOR CARRYING OUT THE INVENTION

Figure 1:
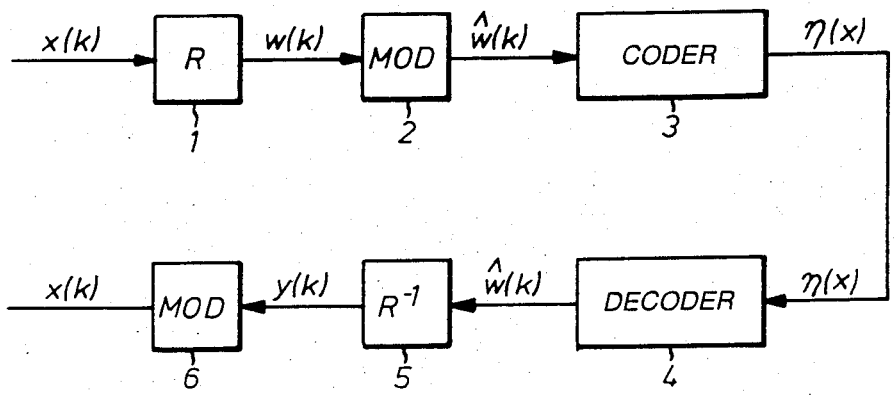
FIG. 1 is a block diagram illustrating an apparatus in accordance with the invention.

FIG. 1 thus illustrates the general appearance of an apparatus in accordance with the invention, which includes means 1 for forming a residue, means 2 for carrying out a modulo Q operation and an encoder 3. This part of the apparatus executes a compression of a sequence x(k), K= ... −1, 0, 1, 2 ... of digital signals forming the input signal to the apparatus. The digital signals may be samples of an analogue signal, these samples assuming Q discrete values between 0 and Q−1. The sequence x(k) is fed to the means 1, which forms the residue w(k), where k= ... −1, 0, 1, 2 and the residue is modulo Q reduced in the means 2, the sequence $\hat{w}(k)$ being formed. This sequence is then fed to the encoder 3 which encodes the sequence $\hat{w}(k)$ using some known method, e.g. Huffman encoding, a sequence n(k) of code words containing the same information as the original sequence x(k) being formed. The code word sequence n(k) thus constitutes the compressed sequence, and can be stored in a memory or sent to some other apparatus.

When it is desired to reconstruct the original sequence x(k) from the compressed sequence n(k) the apparatus shown in the lower part of FIG. 1 is utilized, this apparatus including a decoder 4, inversion means 5, which carry out an inversion operation in relation to the operation carried out by means 1 for forming a residue, and means 6 for carrying out a modulo Q operation. In this part of the apparatus the compressed sequence n(k) is decoded in the decoder 4, the input signal sequence $\hat{w}(k)$ to the encoder 3 being recreated. This sequence $\hat{w}(k)$ is fed to the inversion means 5, which form a sequence y(k), which is fed to the means 6, which carries out a modulo Q operation on the sequence, the original sequence x(k) thus being retrieved.

Figure 2A:
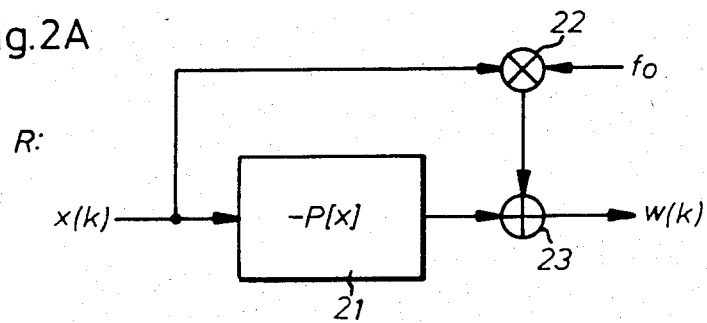
FIGS. 2A and 2B are block diagrams and illustrate the general structure for the means included in the blocks R and $R^{-1}$ in FIG. 1, FIGS. 3A and 3B being block diagrams and illustrating the construction of the apparatus in accordance with the invention in the case where the block R is a transversal filter.
Figure 2B:
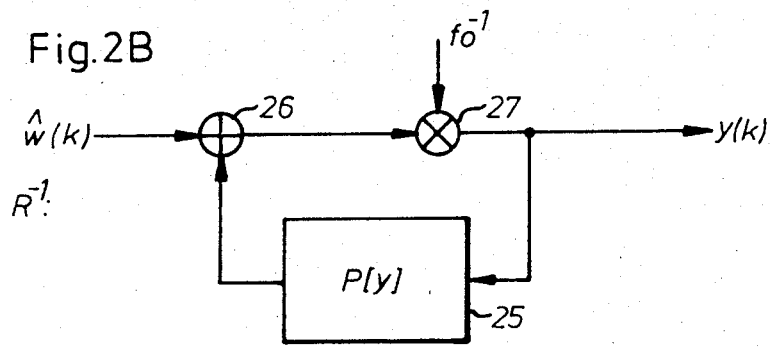

The general structure of the inversion means 5 and the means 1 for forming the residue illustrated in the block diagram of FIG. 1 illustrated in FIGS. 2A and 2B. The means 1 include a predictor 21 receiving on its input the sequence x(k) of digital signals which are to be compressed and on its output sending the negated, predicted value to an adder 23. The sequence x(k) is also connected as input signal to a multiplier 22, where it is multiplied by a coefficient $f_0$. The output from the multiplier 22 is connected to the adder 23, which sends the residue w(k) on its output.

The inversion means 5 have the appearance illustrated in FIG. 2B, and includes a predictor 25 receiving the output signal y(k) on its input from the circuit, this predictor sending the predicted value on its output to an input of adder 26, which receives on its second input the decoded sequence $\hat{w}(k)$ and has its output connected to a multiplier 27, which receives the coefficient $f_0^{-1}$ on its second input, its output signal being the same as the output signal y(k) from the circuit.

The predictor 21 is a means, generating from a sequence x(k) of the values, a value:

$$p(k) = P[x(k-1), x(k-2), x(k-3), \ldots]$$

The function P[x] can be completely arbitrary linear, non-linear, recursive etc. The only condition is that the generated value w(k) is a positive or negative integral number. The predictor 25 functions in a corresponding way as the predictor 21. The predictors 21 and 25 may be realized, for example, as an entirely general function $S[x] = S[x(k-1), x(k-2), \ldots]$ followed by an optional quantizer.

At the start of the compressed and reconstruction, e.g at k=0, it is necessary to know x(k) and y(k) for k= −1, −2, −3 ... in order to calculate p(k). This problem is solved by putting these values equal to zero or to some other arbitrary definite sequence of values. The means 1 and inversion means 5 are thus allowed to start from the same state.

In the following, with reference to FIGS. 3A and 3B, there is illustrated the construction of the apparatus in accordance with the invention when the means 1 is a transversal filter. In this case the residue w(k) is formed as:

$$w(k) = -\sum_{i=0}^{N} f_i x(k-i)$$

where $f_i$ are weighting coefficients, where i=0, 1 ..., N. The method in accordance with the invention assumes that the weighting coefficients $f_i$ are integral numbers. Examples of such filters as are usable as in this connection are

| | | | | |
|---|---|---|---|---|
| N = 1 | $f_0 = 1$, | $f_1 = -1$ | | |
| N = 2 | $f_0 = 1$, | $f_1 = -2$, | $f_2 = 1$ | |
| N = 3 | $f_0 = 1$, | $f_1 = -3$, | $f_2 = 3$, | $f_3 = -1$ | which form the first, second and the third difference of the sequence x(k).

Figure 3A:
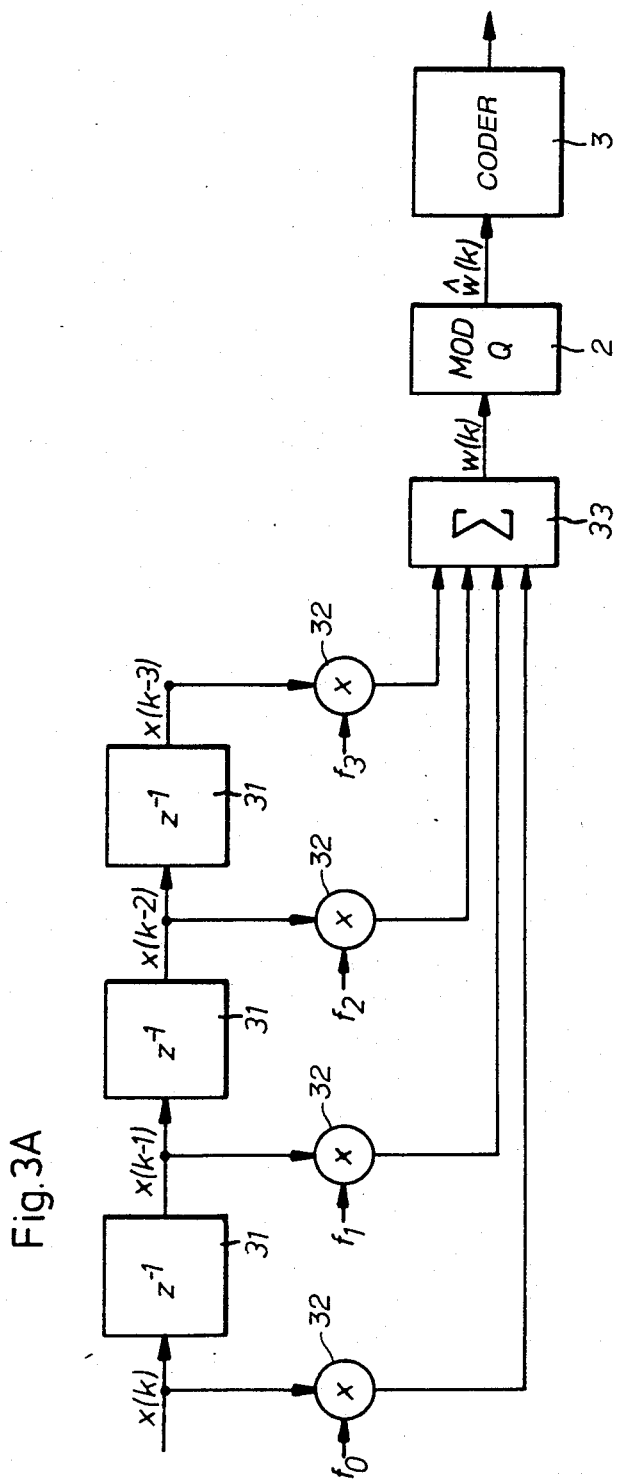

An example is illustrated in FIG. 3A of how the means 1 for forming the residue w(k) can appear in the case where N=3. The means 1 then include delay units 31, receiving the sequence x(k) as an input signal for compression and which each delays the input signal by a time unit so that when x(k) appears on the input of the delay unit, x(k−1) occurs on its output. In addition, there is included the multiplier 32, receiving on one input the signal from the respectively delay unit 31, and on its other input the integral number coefficient $f_i$ by which the x-value is to be multiplied. The outputs of the multipliers are connected to the inputs of an adder 33, the residue w(k) being obtained on the output of this adder. The output from the adder 33 is the same as the output from the means 1 in FIG. 1, and the remainder of the apparatus agrees with corresponding parts of the apparatus in FIG. 1, this part thus not being described in more detail.

In an alternative embodiment, modulo Q operations can be carried out inside the filter, when the filter is linear, as in this case, by the multipliers 32 and the adder 33 being formed as modulo Q multipliers and modulo Q adder, respectively the circuit then being particularly simple to realize, especially when Q is a power of 2.

The reconstruction takes place using an inversion filter which carries out the operation:

$$y(k) = f_0^{-1} \left[ \hat{w}(k) - \sum_{i=1}^{N} f_i y(k-i) \right]$$

where $f_0^{-1}$ is the inverse modulo Q for $f_0$.

Figure 3B:
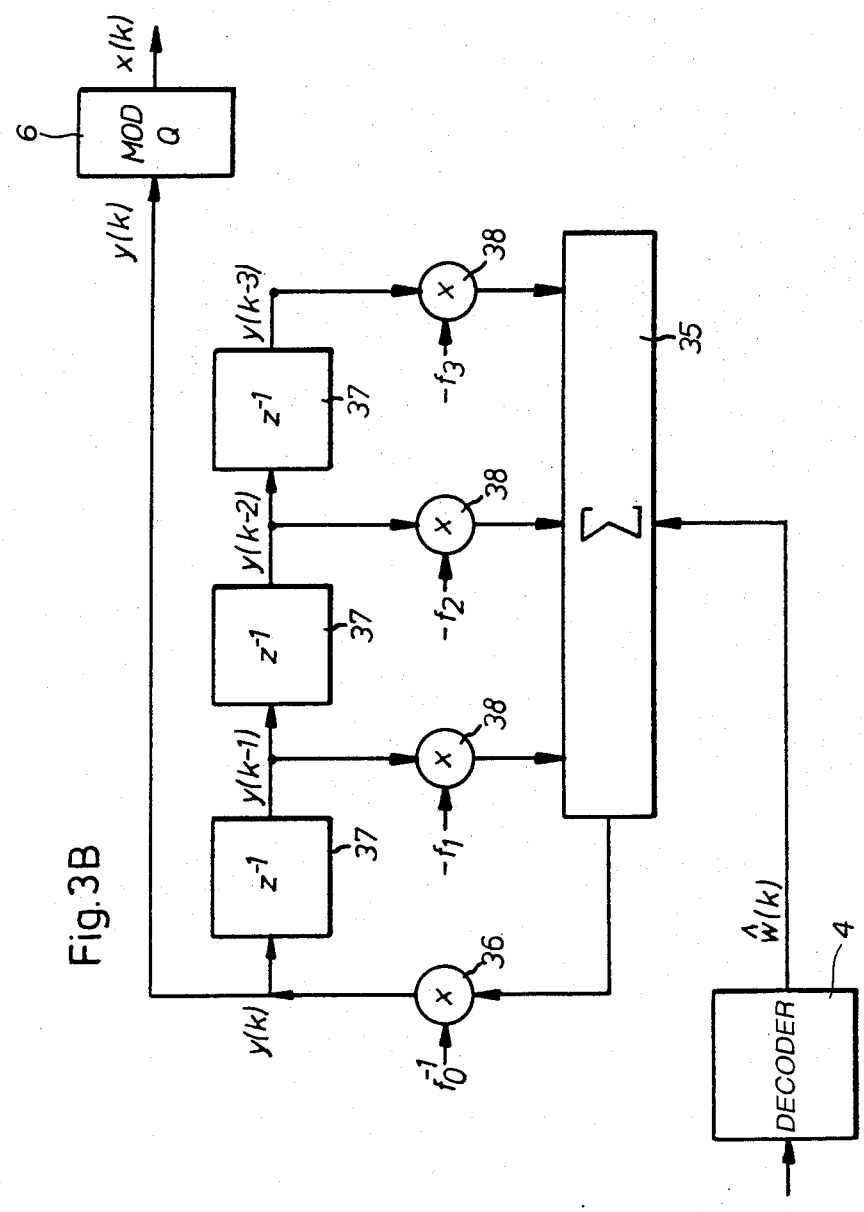

An example is illustrated in FIG. 3B of how the inversion filter can be implemented i the case with the assumption made above that N=3. The filter includes an adder 35, receiving on an input the decoded sequence w(k), which is to be added to the terms on the other inputs. The output from the adder 35 is connected to a multiplier 36, receiving the coefficient $f_0^{-1}$ on its second input, and having its output signal y(k) forming the output signal from the filter and the input signal to delay units 37, in which the y-value is delayed by a time unit, so that when y(k) occurs on the delay unit input, y(k−1) occurs on its output. The outputs from the delay units 37 are connected to the multipliers 38, receiving the coefficients $-f_1$, $-f_2$ and $-f_3$ on their second inputs and having their outputs connected to the adder 35. The decoder 4 and the means 6 for carrying out the modulo Q operations are the same as those shown in FIG. 1.

The original sequence x(k) is thus obtained as x(k)=y(k) modulo Q.

In order that the reconstruction will give the correct result, $f_0^{-1}$ must exist, which means that the equation $f_0 \times f_0^{-1} = 1$ modulo Q must have a solution for some $f_0^{-1} = 0, 1, \ldots, (Q-1)$.

This is the case if $f_0$ and Q are selected such that they are relatively prime, i.e. lack common factors different from 1. The above mentioned filters meet all these requirements for arbitrary Q, since they have $f_0 = 1$.

In an alternative embodiment, as with the case FIG. 3A, modulo Q operations can be carried out inside the filter by that the multipliers 36 and 38 and the adder 35 being formed as modulo Q multipliers and a modulo Q adder, respectively.

It should further be mentioned that the invention can be realized ion either hardware or software.

Finally it should be emphasized that even though the invention has been described as applied to digital signals, it covers reversible compression of all information-carrying symbols for which addition, subtraction, multiplication and modulo Q operations can be defined.

I claim:

1. A method of increasing the compression degree when reversibly compressing a sequence x(k) of information carrying symbols which can assume Q discrete values, where k is an integral number, comprising processing said sequence x(k) by creating a prediction value p(k) from at least one of the previous symbols in said sequence x(k) and forming a residue w(k) from said prediction value p(k) and from a number of (N) of said symbols x(k), executing a modulo Q-operation on said residue w(k) such that the entropy for the residue ŵ(k) thus obtained is decreased thereby increasing the compression degree of said sequence x(k), coding the residue w(k) to form a compressed sequence n(k) of information carrying symbols which contains the same information as the original sequence of symbols.

2. A method as claimed in claim 1, wherein the processing step of forming a residue w(k) being a linear filter, which forms the residue w(k) with the aid of additions and multiplications, characterized in that the additions and multiplications are executed as modulo Q additions and modulo Q multiplications.

3. A method as claimed in claim 2, characterized in that Q is a power of 2.

4. A method as claimed in claim 1, characterized in that Q is a power of 2.

5. A method of reconstructing a sequence x(k) of information-carrying symbols, which have been compressed according to one of the preceeding claims, said reconstruction method implying that the compressed sequence n(k) is decoded and that the decoded sequence w(k) is processed in inversion means (5) to form a sequence y(k), characterized in that a modulo Q operation is carried out on the sequence y(k) from the inversion means (5) to obtain the original sequence x(k).

6. A method as claimed in claim 5, said means (5) for forming the sequence y(k) being a linear inversion filter, which forms the sequence y(k) with the aid of additions and multiplications, characterized in that the additions and multiplications are carried out as modulo Q and modulo Q multiplications, respectively.

7. A method as claimed in claim 6, characterized in that Q is a power of 2.

8. A method as claimed in claim 5, characterized in that Q is a power of 2.

9. Apparatus for compressing a sequence x(k) which can assume Q discrete values, where k is an integral number, comprising first means (1) to form a residue w(k) having a starting point in said sequence x(k) of information carrying symbols, second means (2) to perform a modulo Q-operation on said residue w(k), the entropy for the residue ŵ(k) thus obtained being decreased, and coding means (3) to perform a predictive coding of the residue ŵ(k) to create a compressed sequence n(k) of information carrying symbols containing the same information as the original sequence x(k) of information carrying symbols.

10. Apparatus as claimed in claim 9, the means (1) for forming a residue w(k) being a linear filter, which forms the residue w(k) with the aid of adders and multipliers, characterized in that the adders and multipliers are modulo Q adders and modulo Q multipliers.

11. Apparatus for reconstructing a sequence x(k) of information-carrying symbols which have been compressed with apparatus as claimed in claim 10, said reconstruction apparatus including a decoder (4), which is adapted to decode the compressed sequence n(x) to form a decoded sequence w(k), and inversion means (5) adapted to form a sequence y(k) by an inversion operation on the sequence ŵ(k), characterized by means (6) for carrying out a modulo Q operation on the sequence y(k) from the inversion means (5) for obtaining the original sequence x(k).

12. Apparatus for reconstructing a sequence x(k) of information-carrying symbols which have been compressed with apparatus as claimed in claim 9, said reconstruction apparatus including a decoder (4), which is adapted to decode the compressed sequence n(x) to form a decoded sequence ŵ(k), and inversion means (5) adapted to form a sequence y(k) by an inversion operation on the sequence ŵ(k), characterized by means (6) for carrying out a modulo Q operation on the sequence y(k) from the inversion means (5) for obtaining the original sequence x(k).

13. Apparatus for reconstructing a sequence x(k) according to claim 12, said means (5) for forming the sequence y(k) being a linear inversion filter which forms the sequence y(k) with the aid of adders and multipliers, characterized in that the adders and multipliers are modulo Q adders and modulo Q multipliers, respectively.

* * * * *